United States Patent [19]

Bennett, Jr.

[11] 4,152,650

[45] May 1, 1979

[54] CONTINUOUSLY-SYNCHRONIZED TRACKING RECEIVER FOR A PRIORI DEFINED SWEPT CARRIERS

[75] Inventor: Victor A. Bennett, Jr., Gloucester, Mass.

[73] Assignee: The Foxboro Company, Foxboro, Mass.

[21] Appl. No.: 790,156

[22] Filed: Apr. 22, 1977

[51] Int. Cl.[2] .............................................. H03D 3/06

[52] U.S. Cl. ...................................... 325/346; 331/18; 329/124; 325/336

[58] Field of Search .................. 325/346, 33, 47, 344, 325/349, 309, 329, 419, 420, 336, 337, 335; 179/15 FS; 329/122, 123, 124; 331/17, 18, 23, 25

[56] References Cited

U.S. PATENT DOCUMENTS

| | | | |
|---|---|---|---|
| 3,238,460 | 3/1966 | Enloe | 325/346 |
| 3,265,986 | 8/1966 | Wychoff | 331/18 |
| 3,906,380 | 9/1975 | Querry et al. | 325/346 |

*Primary Examiner*—Robert L. Griffin

*Assistant Examiner*—Tommy P. Chin

*Attorney, Agent, or Firm*—Andrew T. Karnakis

[57] ABSTRACT

A receiver for a carrier that is swept in frequency in a predetermined manner over a bandwidth comprises frequency tracking with continuous self-synchronization. The frequency tracking permits the carrier to be filtered by a narrowband filter. The filtered carrier is then fed to a frequency discriminator to produce an error signal. A highly-selective phase-locked loop synchronizes only to the desired component of the error signal in frequency and in phase. The output of the phase-locked loop, after appropriate shaping, is the control signal for tracking synchronously the incoming wave. The output data are obtained at detection after the narrowband filtering.

8 Claims, 10 Drawing Figures

CONTINUOUSLY-SYNCHRONIZED TRACKING RECEIVER FOR A PRIORI DEFINED SWEPT CARRIERS

BACKGROUND OF THE INVENTION

1. Field of the Invention

This invention relates generally to communication systems having characteristics of privacy and resistance to various interferences such as noise or willful or accidental jamming. More particularly, this invention relates to communication systems in which the carrier has its center frequency moved (or swept) continuously over a frequency range which is much wider than the intelligence (or data) bandwidth. This invention relates, even more particularly, to a receiver capable of tracking the center frequency of the received swept carrier by continuous self-synchronization of the tracking means so as to provide for narrowband filtering of the widely swept carrier.

2. Description of the Prior Art

Frequency-tracking receivers have been known in the art. In one embodiment, the receiver has an internal oscillator with an output which is of a different center frequency than the received carrier but of similar sweep. The sweep of the internal oscillator is of identical frequency and phase and of nearly the same amplitude as the received carrier. As the received carrier and the output of internal oscillator are mixed, an IF carrier is obtained which has only a small sweep associated with it. The result is that the IF carrier may be filtered through a narroww bandwidth.

In another embodiment, the received carrier is passed through the narrowband filter whose center frequency tracks the center frequency of the received carrier. Here again, the received carrier of a wide frequency sweep is filtered through a narrow bandwidth.

Generally speaking, frequency tracking receivers are used in two types of applications:

(1) In the first type of application, it is desired to track all deviations of the carrier from its center frequency. Thus, for example, a carrier of a complex non-predescribed deviation will have its total deviation tracked at each instant. Applications of this type include FM demodulation at a lowered noise threshold, and a reduction of the effect of incidental FM in AM transmissions.

(2) In the second type of application, it is desired to track a certain periodic component of the deviation which is known in priori in amplitude and shape, and almost known in rate and phase; all other components of the frequency deviation should not be tracked. Applications of this type are in communication systems utilizing the wideband sweeping of the carrier for privacy or resistance to jamming and noise.

The implementations of the receivers for the two types of tracking applications differ in basic ways and the present invention relates to the second type. The present invention utilizes a tracking receiver which is uniquely kept in synchronism in frequency and in phase with the received carrier. In the prior art, this synchronization has typically been achieved either by means of separately transmitted synchronization pulses as proposed by Kendall in U.S. Pat. No. 1,592,940, or by means of synchronization pulses produced in an AM manner in the receiver as described by Silver, et al, in U.S. Pat. No. 2,448,055. Thus, in the prior art, synchronism is maintained in a discrete manner via pulses. Furthermore, the synchronizing mechanism of prior art devices have not taken advantage of the noise and jamming resistance of a widely swept FM carrier.

SUMMARY OF INVENTION

In preferred embodiments of the present invention to be described hereinbelow in detail, it will be seen that the receiver of the present invention is kept in synchronism with the center frequency of the received carrier in a continuous manner and that the synchronization means utilizes the interference and noise resistance of a widely swept carrier.

As the center frequency of the received widely-swept carrier is tracked by the receiver, the carrier is effectively filtered by a narrowband filter. The filtered carrier is then fed to a frequency discriminator to produce an error signal which comprises a component of the desired sweep frequency. A highly-selective phase-locked loop (PLL) responds to the frequency of the desired component of the error signal which is of the sweep frequency and its possible uncertainty. Thus the PLL synchronizes in a continuous manner to the desired component of the error signal and rejects the remainder of the error signal which may comprise the data and other signals. The output of the PLL, after appropriate phase-adjustment and shaping, is the control or sweep signal for tracking in a synchronous manner the center frequency of the received carrier.

Intelligence to be transmitted is superimposed on the carrier by any of the known modulations, such as FM, PM and AM, in analog or digital form, or any combination of these.

Accordingly, a principal object of this invention is the provision of an improved receiver for a periodically-swept carrier as used for privacy of communication and for noise and interference resistance.

A more specific object of this invention is the provision of: (a) self-synchronization of the receiver in which the synchronization is continuous, (b) utilization of the synchronization means of the interference and noise reduction properties of a widely-swept carrier, (c) synchronization which is highly selective, responding only to the a priori specified sweep frequency and shape, and (d) synchronization means of a large time constant, having memory of some appreciable duration, permitting intentional or unintentional lapses in the incoming sweep signal.

Other objects, aspects, and advantages of the invention will in part be pointed out in, and in part apparent form, the following description considered together with the accompanying drawings.

DESCRIPTION OF PREFERRED EMBODIMENTS

Figure 1:
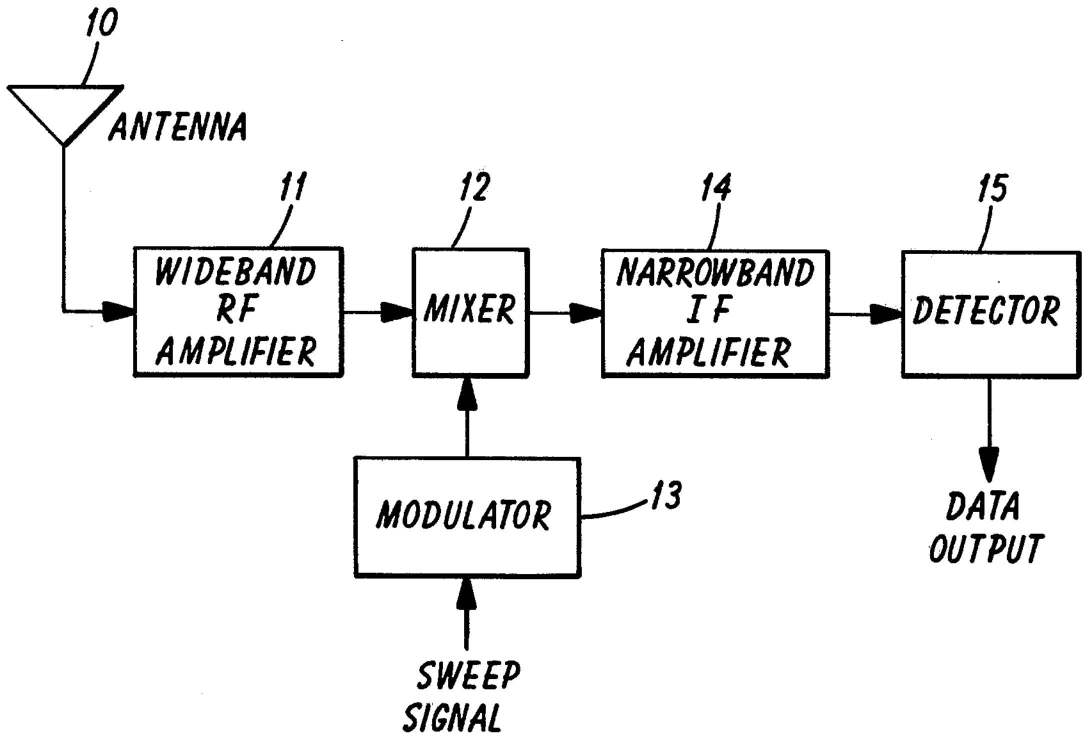
FIG. 1 is a block diagram showing elements of a tracking receiver for a periodically swept carrier.

Reference is made now to FIG. 1 which shows in diagrammatic form elements of tracking receiver for a carrier whose center frequency is being swept over a wide frequency band. The carrier received by an antenna 10 is first passed through a wideband RF amplifier 11 for amplification, rough filtering, impedance matching, isolation, etc., and then fed to one input of a mixer 12. The other input to the mixer is from an FM modulator 13 whose output is a carrier that is swept in a manner similar to that of the received carrier but is not modulated by intelligence. In particular, the output of the FM modulator may be a voltage-controlled oscillator the output of which is a carrier whose center frequency differs from that of the received carrier by the IF center frequency but its sweep is identical in rate and phase while the sweep range is almost the same as that of the received carrier. The difference-frequency component at the output of the mixer 12 is of the IF center frequency with only little sweep in its center frequency. It is, therefore, a narrowband wave that may be filtered by a narrowband IF amplifier 14. The output of the narrowband IF amplifier is fed to a detector 15 to obtain the output data.

As an example, consider the case where the received carrier, quiescently at 100 MHz, is being swept in a sinusoidal manner over the range of ±1.5 MHz at a rate of 7.5 KHz. Suppose now that the FM modulator 13 is designed with a quiescent frequency of 90 MHz and a sinusoidal sweep of ±1.485 MHz, but of same rate and phase as the received carrier. The difference-frequency component at the output of the mixer 12 will be of quiescent frequency 10 MHz with a sinusoidal sweep of ±15 KHz. The narrowband IF amplifier 14 must be wide enough to accommodate only this remainder of the sweep and the bandwidth of the intelligence.

It will be evident to those versed in the art that many variations of this basic block diagram are possible. For example, the received carrier may be obtained from a cable or a waveguide rather than from an antenna. Another possibility is that the wideband RF amplifier 11 may be left out or that additional mixers or amplifiers are inserted. A more basic variation will be subsequently described in connection with FIG. 8. Also the implementation of an appropriate detector will depend upon the type of intelligence modulation that is imposed on the received carrier.

Figure 2:
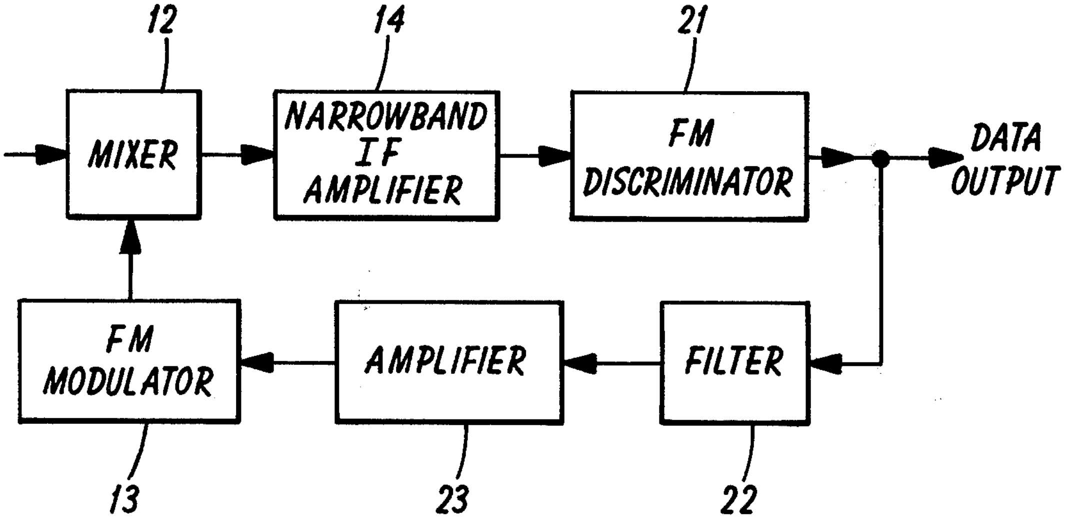
FIG. 2 is a block diagram of an FM feedback loop that performs compression of a carrier's frequency deviation but is not selective to an a priori specified sweep frequency and shape.

To determine how the receiver obtains the sweep signal for the FM modulator 13 so as to produce internally a carrier that tracks in rate and phase the sweep of the received carrier, reference is made now to FIG. 2 which shows a block diagram of an FM feedback loop. This loop, which compresses frequency deviations of an applied carrier, is well known. However, it is not appropriate for the reception of a swept carrier as will now be briefly shown. In FIG. 2, as in FIG. 1, the received FM carrier and the FM carrier generated by the FM modulator are fed to the mixer 12, the difference-frequency output of which is of the IF center frequency. In a properly designed FM Feedback loop, the carrier at the output of the FM modulator has a frequency deviation which tracks closely, though not identically, the instantaneous frequency deviation of the received carrier. It is a negative feedback loop in which the frequency deviation is the controlled quantity. Therefore, the difference-frequency component at the output of the mixer is an FM carrier of a much narrower bandwidth than the bandwidth of the received carrier. It may, therefore, be passed through the narrowband IF amplifier 14. To complete the loop, an FM discriminator 21 is used to detect an error signal based on the difference between the instantaneous deviations of the received carrier and the output of the FM modulator. This error signal is passed through the filter 22 and imputted to an amplifier 23 before being fed as a control signal to the FM modulator. Methods of design of such a loop are explained, for example, in J. Klapper and J. Frankle, *Phase-Locked and Frequency-Feedback Systems,* Academic Press, New York, 1972.

The FM Feedback loop is not appropriate in my intended application for several reasons. Firstly, the loop is not selective to an a priori known range, frequency, and shape of the sweep. It responds to any arbitrary frequency deviation of the received carrier as long as it is within the bandwidth of the loop. Therefore, competing transmissions within the band whether for the purpose of multiplexing or jamming, intentional or inadvertant, may interfere unduly with the operation of the receiver. Secondly, a considerable amount of received thermal and other noise is fed around the loop producing the so-called "feedback noise threshold" at the FM discriminator 21. This sets a limit to the amount of gain permitted for the loop, which in turn limits the amount of deviation compression that is feasible. For example, in order to reduce a sweep of 3 MHz in the received carrier to 15 KHz, a loop gain of about 200 at the frequency of the sweep rate is required. This, depending upon other parameters of the loop, may be in excess of that permitted in order to prevent a feedback noise threshold. Thirdly, in the FM feedback loop like in other feedback systems, one must limit the amount of phase shift any signal with a loop gain of greater than unity may be subjected to when going around the loop, for the sake of stability. This in turn limits the selectivity of the narrowband IF amplifier 14 and the filter 22. Therefore the FM feedback loop is better suited to track arbitrary deviations of the carrier from its center frequency as described by Guanella in U.S. Pat. No. 2,206,695 for the suppression of incidental FM, or to demodulate FM at a lowered noise threshold. As is taught by Guanella, a basic design criterion of the FM feedback loop is that the time constants be "small". This will be seen to be in contradistinction to my present invention where the time constants are large.

Figure 3:
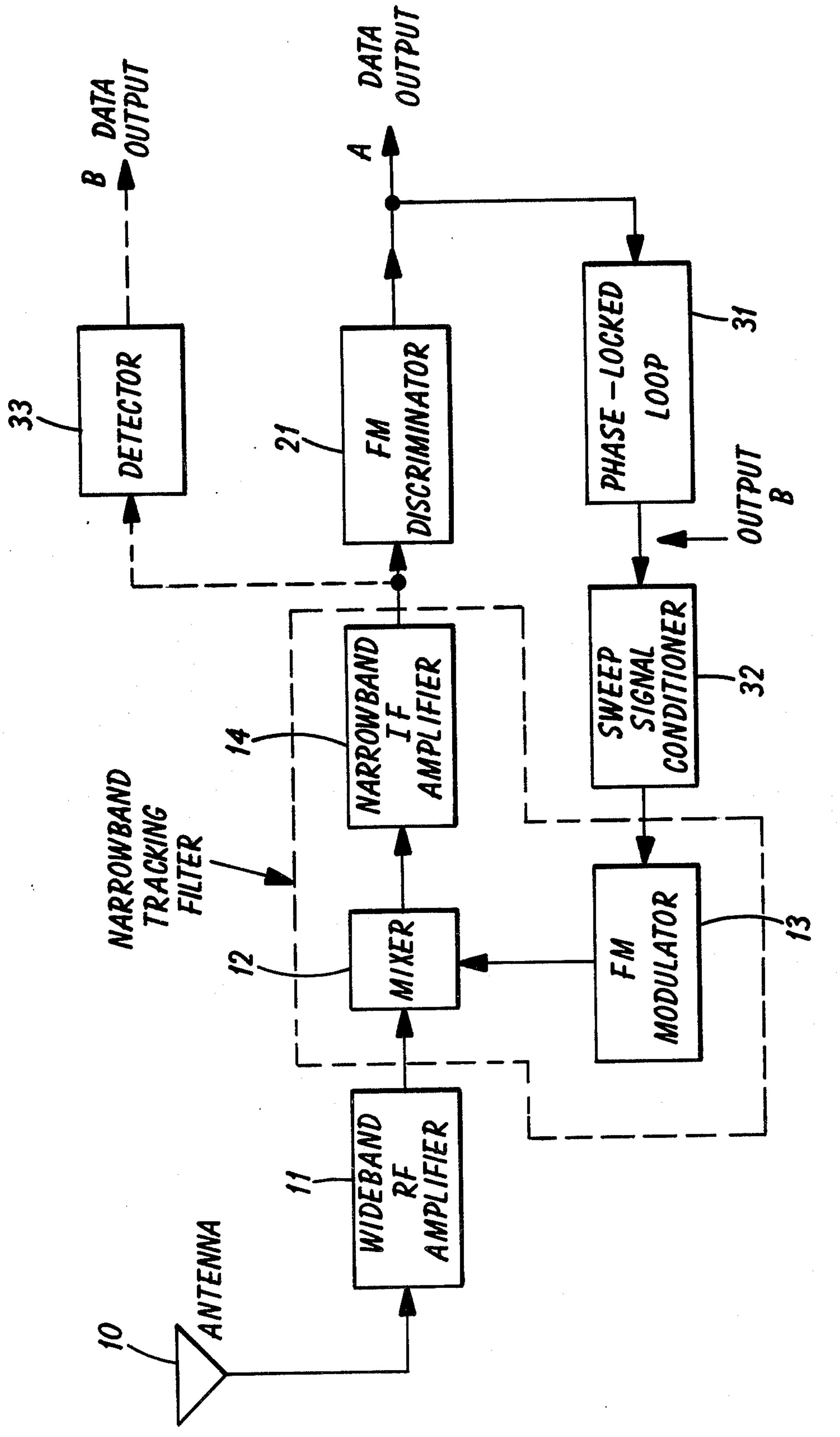
FIG. 3 is a block diagram of one embodiment of the present invention.

A block diagram of a preferred embodiment of my present invention is shown in FIG. 3. The antenna 10, wideband RF amplifier 11, mixer 12, FM modulator 13, and narrowband IF amplifier 14 are as in FIG. 1. The output of the narrowband IF amplifier is fed to an FM discriminator 21 to produce an error signal which is a replica of the remaining frequency deviation of the carrier. It is noted that complete cancellation of the carrier sweep will not produce my desired results. Rather, it is essential that a sweep of small deviation remain in order that a continuous error signal be present at the output of the FM discriminator. This discriminator may be of any of the known types such as the Foster-Seeley, pulse-counting, ratio-detector types, or the feedback loop types such as the FM feedback loop, the phase-locked loop, etc. This error signal includes a desired component which is identical in frequency and fixed in its phase relationship to the sweep signal required to be fed to the FM modulator. However, the desired component is embedded in a variety of interfering components due to other transmissions within the bandwidth of the received swept carrier, the intelligence, or noise.

The present invention requires that the error signal be fed to the phase-locked loop (i.e., PLL) 31, of very narrow bandwidth (i.e., large time constants). The PLL, to be described in some detail below, synchronizes in frequency and in phase to the desired component of the error signal and rejects all interfering components. This is performed in a continuous manner, as the error signal is continuous. However, for short term lapses in the error signal, whether intentional or inadvertant, the PLL will continue to be essentially in synchronism due to the flywheel effect of its large time constants. Thus at the output of the PLL 31 appears a signal identical in frequency to the sweep of the received carrier but usually shifted from it in phase (or delayed in time) by a fixed amount due to phase shifts in the narrowband If amplifier 14, the FM discriminator 21, and the PLL. A sweep signal conditioner 32 adjusts for this difference in phase or time delay, if necessary. In addition, it may alternate, amplify, and shape the output of the PLL to render it identical in shape to the sweep of the received carrier and appropriate in amplitude. For example, if the output of the PLL is a sinewave inappropriate in phase and the sweep waveform is a sinewave, then the sweep signal conditioner may simply be a phase shifting network. On the other hand, if the output of the PLL is a square wave delayed in time and the sweep is of a sawtooth shape, then the sweep signal conditioner would comprise a delay network and, in addition, a shaping network that would change a square wave to a sawtooth wave. These circuits are common and are well-known to those versed in the art. Also some or all of the signal conditioning may be performed inside the PLL, as described presently. Thus a sweep signal of appropriate shape, phase, frequency, and amplitude required to control the FM modulator 13 is obtained at the output of the sweep signal conditioner. An example of suitable circuitry for performing the functions of the PLL and the sweep signal conditioner is an IC chip referred to as XR-2206,manufactured by XR Corporation.

The transmitted intelligence may be obtained at the output of the FM discriminator 21 if it was transmitted in an FM manner, or at the output of a detector 33 if it is of another modulation type, such as AM or PM. In the latter case, the detector is the appropriate type for the modulation used.

Figure 4A:
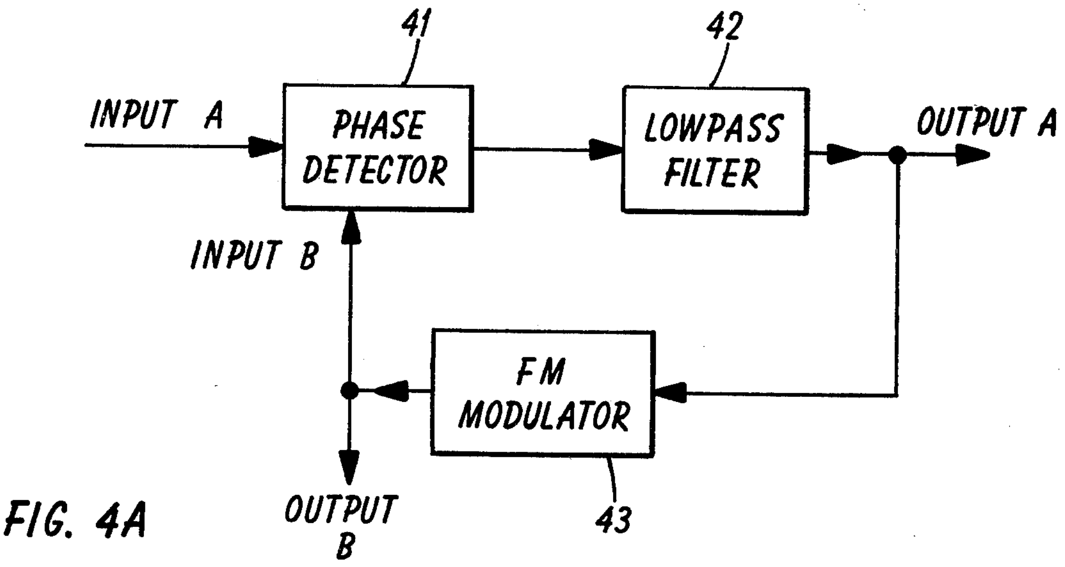
FIG. 4A is a block diagram of a phase-locked loop used in the preferred embodiments of the present invention.
Figure 4B:
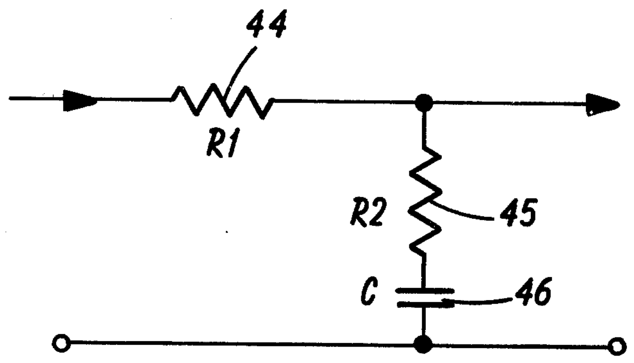
FIG. 4B is a lead-lag network used as the lowpass filter in the PLL.

A block diagram of a conventional phase-locked loop is shown in FIG. 4A. A phase detector 41 compares the phases of two periodic waveforms appearing at inputs A and B, and produces at its output a signal which is related to this phase difference. For example, when the phase detector is simply a multiplier, then its DC output is zero when the two periodic waveforms are of identical frequency but 90° with respect to each other, and maximum when said waveforms are in phase. A lowpass filter 42 removes any components of the waveform frequency or its harmonics that appear at the output of the phase detector 41, and also contributes to the dynamics of the loop. Alternate possible forms of the lowpass filter are shown in FIG. 4B as a lead-lag network and FIG. 4C as a lag network. The loop is closed by feeding the output of the lowpass filter as a control signal to an FM modulator 43, which in turn feeds one of the inputs of the phase detector 41.

When a phase-locked loop is used as an FM discriminator, then the output is taken at Output A. When, as in this invention, the phase-locked loop is used to obtain a synchronized periodic waveform then the output is taken at Output B.

It is a basic characteristic of a properly operating phase-locked loop (PLL) that the frequency of the waveform at the output of the FM modulator 43 is identical to the frequency component of the waveform at Input A of the phase detector 41 to which it is being synchronized and that their phase relationship is fixed. In the present invention, the component of the waveform at Input A is the desired component of the error signal which is of the sweep frequency. In order to force the PLL to respond only to this desired component, the sweep rate of the incoming carrier and that of the free-running frequency of the FM modulator are first made very stable. For example, for a sweep rate of 7.5 KHz and a frequency stability of 0.001%, the two waveforms are known a priori to be off at any time by no more than 0.15 Hz. Such stabilities, for example, may be obtained by use of temperature or crystal control on the oscillators. With this a priori knowledge, the PLL is designed as narrowband as possible to reject all undesired components at Input A while causing very little phase shift when the frequency uncertainty moves between 0 and 0.15 Hz.

As an example, consider the case where the lowpass filter 42 is of a high cutoff frequency so that it only filters input waveform components and does not contribute to the dynamics of the loop. The PLL bandwidth B is then given by $$B=(K/2\pi)\text{Hz}$$

where K is the open loop gain. If the open loop gain K is chosen as 100, the PLL bandwidth is about 15 Hz and the phase shift between no offset and maximum frequency offsets is about 0.5°. No waveform which is more than 15 Hz away from the nominal free-running frequency of the FM modulator 43 can synchronize the PLL. Therefore, using the a priori knowledge of the frequency of the sweep we can design a PLL which will reject abruptly other components at its input. The design of PLL's is now well documented in the literature, as for example in the aforementioned J. Klapper and J. Frankle book.

Figure 4C:
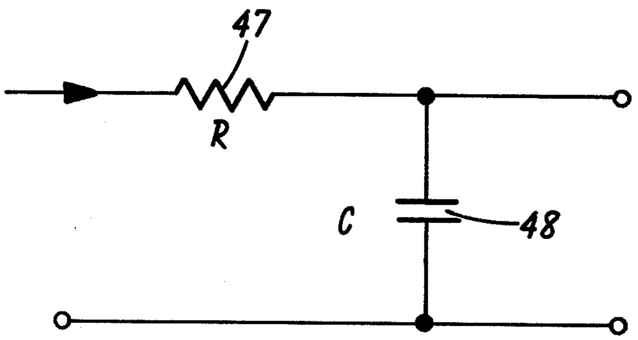
FIG 4C is a lag network that may be alternately used as the lowpass filter in the PLL.

It is to be emphasized that the PLL 31 having been described above in a simple form has many possible variations and additional complexities. Some of these have already been referred to above; namely, the lowpass filter 42 can be made to contribute to the in-band performance of the loop and its dynamics. Two forms of such filters are shown in FIG. 4B and FIG. 4C. Other forms are also known. PLL's have also been designed in a multiple-loop topology. Additionally, Input A and Output B may have a variety of waveforms, with the typical examples being sinusoidal, square wave, and sawtooth types. Furthermore, various functions of the sweep signal conditioner 32 of FIG. 3 may instead be performed in the PLL; for example, a delay network placed between the lowpass filter and the FM modulator 43 (see FIG. 4A) will adjust the phase or time base. Other variations may include blocks representing frequency changing or amplification. All of these loops, while having their individual advantages and disadvantages in a particular application, have in common, however, the basic property of the PLL required in the present invention, i.e., when synchronized, the frequency of the waveform at the output of the FM modulator 43 is identical to the frequency of the desired component of the waveform at Input A and bears to it a fixed relationship in phase.

Figure 5:
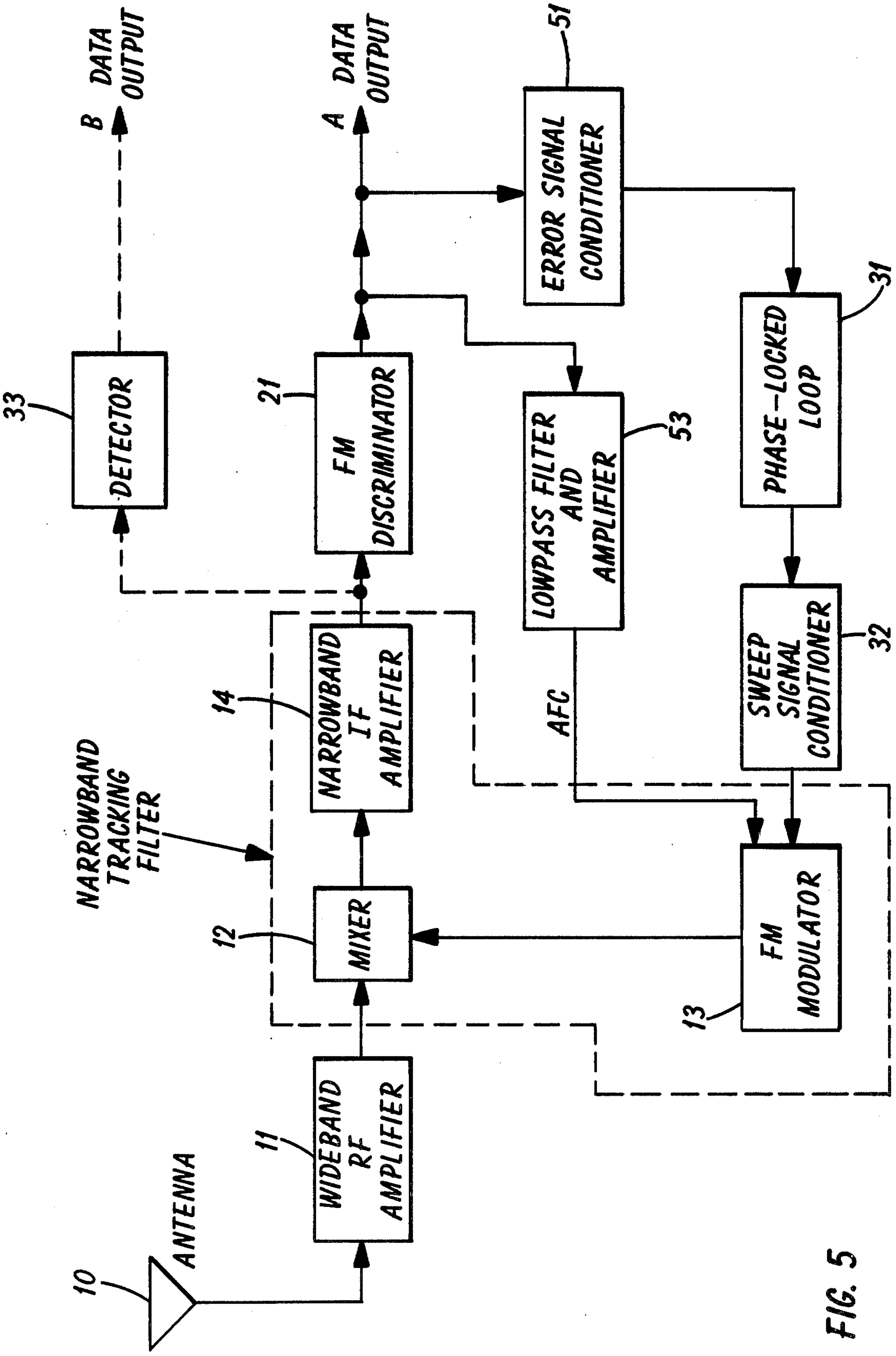
FIG. 5 is a block diagram of the embodiment of the present invention expanded somewhat to show use of an arbitrary periodic sweep shape, and including automatic frequency control.

The basic block diagram of the preferred embodiment of the present invention may be expanded to incorporate additional flexibilities such as shown in FIG. 5. One of these is a signal conditioner 51 connected between the FM discriminator 21 and the PLL 31. This block, for example, may include a sharp filter to reject some strong undesired components of the error signal. In another case it may act as an intelligence canceller. As an example of the latter, consider the case where the intelligence is transmitted in a binary manner by keeping the sweep waveform between two amplitudes. The signal conditioner would then cancel the effect of the intelligence if it acts like an amplitude limiter or fast-acting AGC.

Other possible functions of the signal conditioner 51 are changing the waveform from that produced by the FM discriminator 21 to that preferred by the PLL 31, or simply attenuating or amplifying the level of the error signal. FIG. 5 also shows the possibility of including a lowpass filter and amplifier 53 for automatic frequency control (AFC) by combining the AFC and sweep signal through a conventional summing circuit (not shown) to compensate for long-term drift of the center frequencies.

Figure 6:
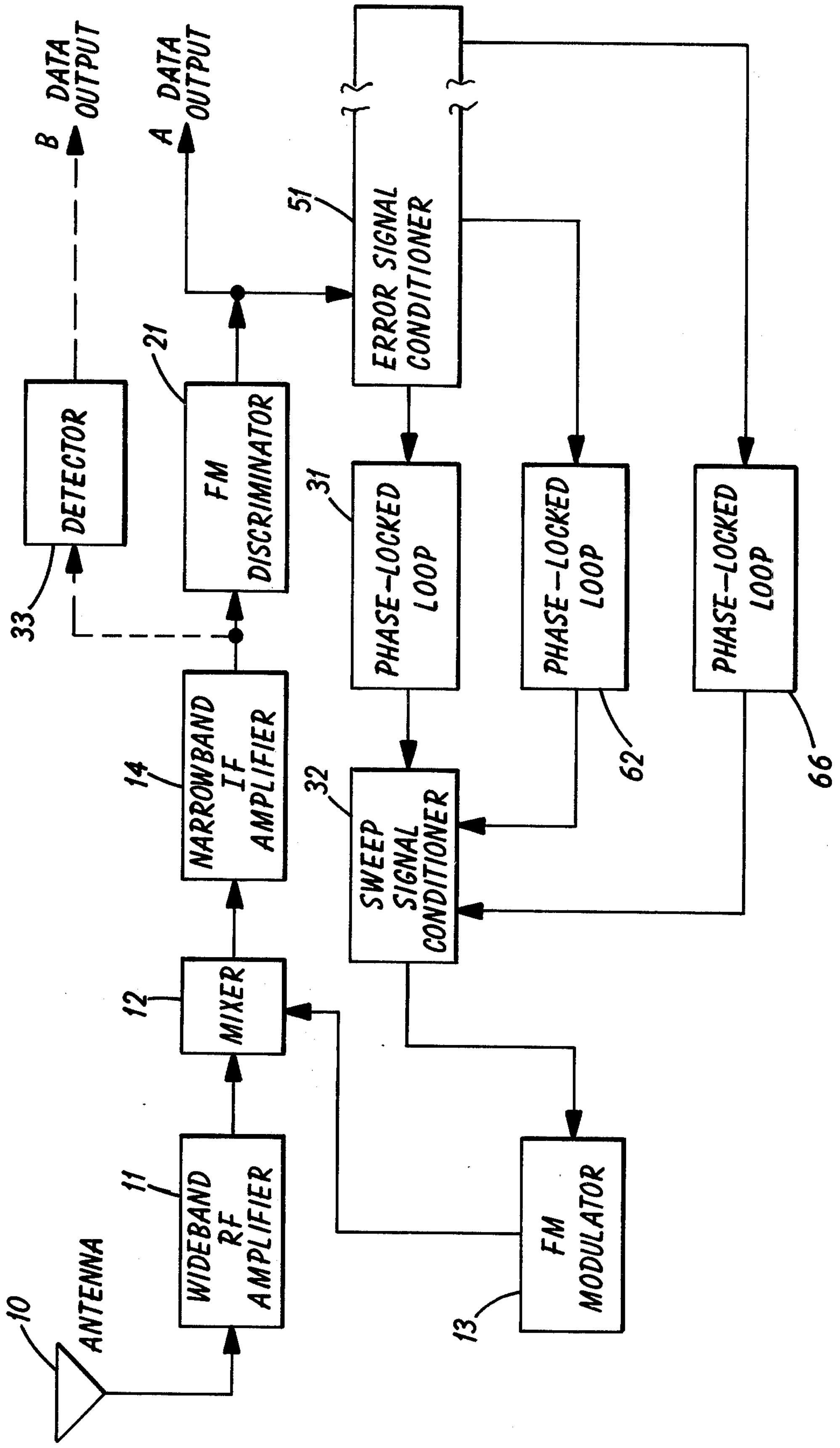
FIG. 6 is a block diagram of the embodiment of the present invention in which the sweep is a complex waveform.

Complex sweeping patterns are readily tracked within the context of the present invention. Reference is now made to FIG. 6 which shows a block diagram for such tracking. If the complex sweep waveform is comprised of a multiplicity of components of frequencies not harmonically related, then for each frequency a different PLL is synchronized. The outputs of the PLL's are fed to the sweep signal conditioner 32 which combines these signals in pre-selected proportions such as to replicate the original incoming wave pattern produced at the transmitter, thereby producing the required sweep signal to control the FM modulator 13. It is clear that the sweep signal may be comprised of any number of frequency components and waveshapes.

Figure 7:
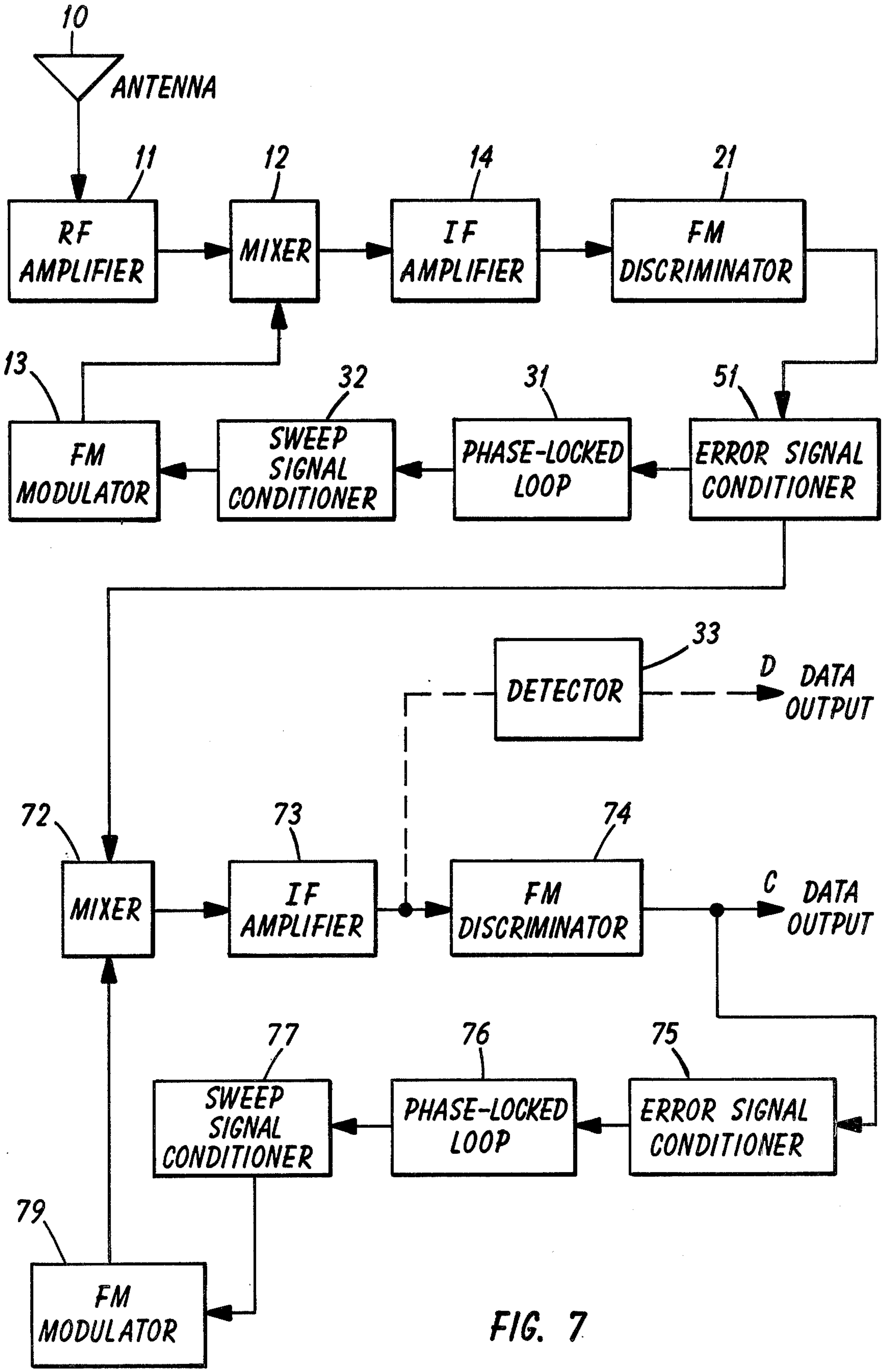
FIG. 7 is a block diagram of an alternate embodiment of the present invention in which a subcarrier is also being swept.

A block diagram of another embodiment of the present invention for a sweep waveform of a different complexity is shown in FIG. 7. In this case the output of the FM discriminator 21 is itself a swept sub-carrier. However, the sub-carrier is swept only over a relatively small bandwidth compared to the main carrier. Synchronization to the sweep of the sub-carrier is performed in the same manner as for the main carrier. The intelligence output may be obtained at Data Output C if it is FM or at Data Output D if it is of another type of modulation. It is readily apparent that this method may be extended further to sub-sub-carriers, and so on.

Figure 8:
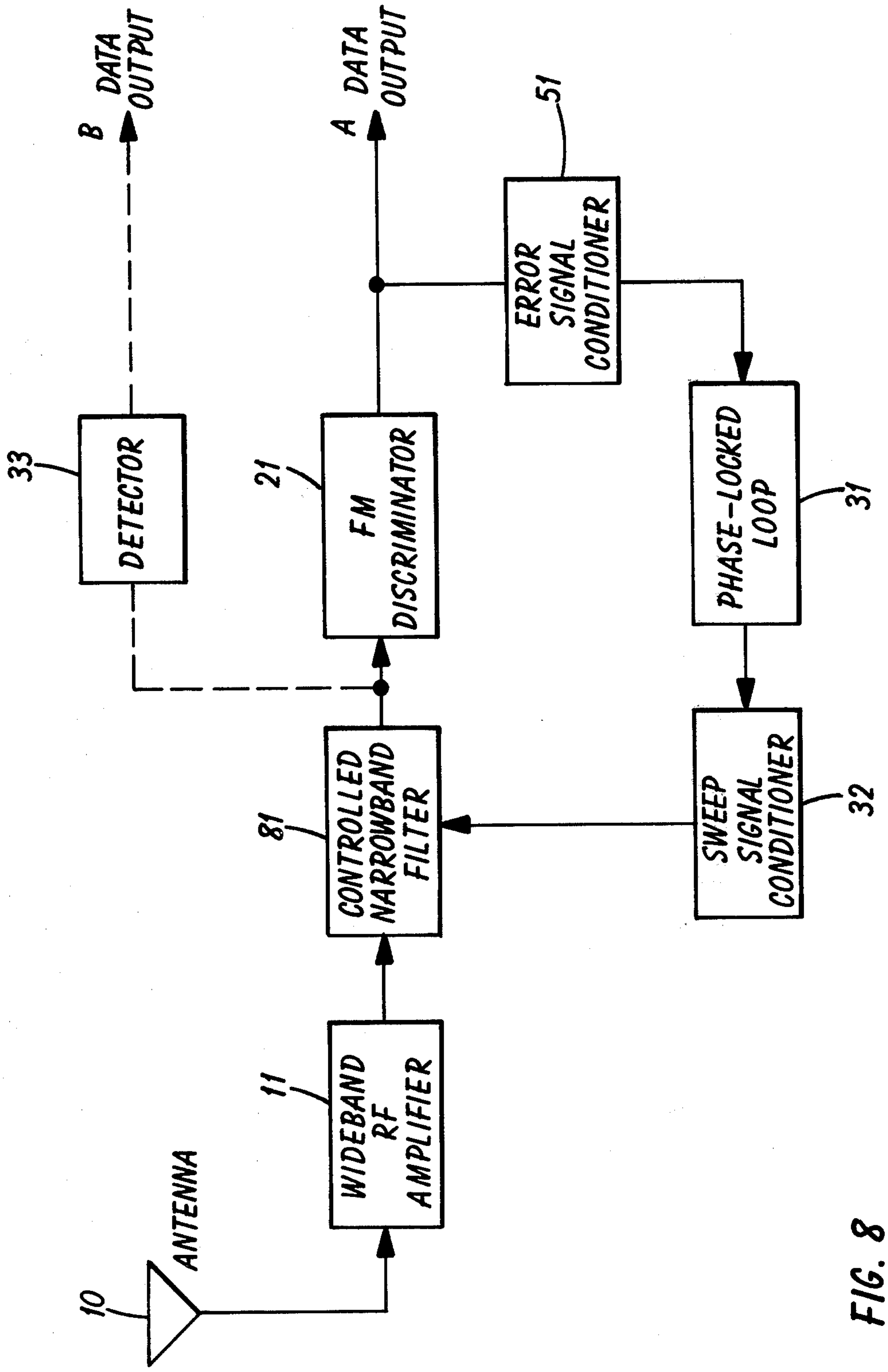
FIG. 8 is a block diagram of still another embodiment of the present invention in which frequency tracking is performed by a controlled narrowband filter.

Reference is now made to FIG. 8 which shows a block diagram of another embodiment of the narrowband tracking filter. It differs from that in FIG. 5 in that it includes a controlled narrowband filter 81 in place of the FM modulator 13, mixer 12, and the narrowband IF amplifier 14. In this embodiment, the sweep signal obtained from the sweep signal conditioner 32 is used to move the center frequency of the controlled narrowband filter in synchronism with the sweep of the incoming carrier. This, for example, is accomplished by the use of signal-controlled reactances in the filter. In this manner, the widely-swept incoming carrier is subjected to narrowband filtering producing an effect similar to that of the tracking mixer. Thus, the combination of the mixer, FM modulator, and narrowband IF amplifier, and the controlled narrowband filter may be considered to be different implementations of a narrowband tracking filter, i.e., a narrowband filter whose center frequency tracks the swept center frequency of the incoming carrier, the tracking control being provided by the output of the sweep signal conditioner 32. Although the above description is in terms of conventional analog circuitry, it is noted that analogous digital circuitry or computer operations may be substituted for the various functions whenever it is deemed desirable. Other modifications within the scope of the invention will be apparent to those skilled in the art, in accordance with the individual requirements of specific applications. Accordingly, it is emphasized that the above described preferred embodiments are solely for the purpose of illustrating the invention, and should not be construed as necessarily limiting the scope of the invention and that of the accompanying claims, except as required by the prior art.

I claim:

1. A tracking receiver for a swept carrier whose center frequency is being swept in a predetermined manner over a frequency band, said receiver comprising:

tracking filter means having a carrier input, a sweep signal input, and an output, and producing narrowband filtering for a wave being applied to said carrier input, said filter wave appearing at said output, the center frequency of said narrowband filtering being responsive to a signal appearing at said sweep signal input;

receiving means for said sweep carrier feeding said carrier input of said tracking filter;

FM discriminator means receiving said output of said tracking filter means and producing an error signal output comprising a component at the sweep frequency of said swept carrier;

error signal conditioner means receiving said error signal output and producing an output;

a phase-locked loop receiving said output of said error signal conditioner means and producing an output being of same frequency as said component of said error signal output at the sweep frequency and of substantially constant phase difference from it; and sweep signal conditioner means receiving said output of said phase-locked loop and producing a sweep signal output, said sweep signal output feeding said sweep signal input of said tracking filter means, and being of frequency, phase, shape, and amplitude required to produce tracking of said center frequency of said narrowband filtering of said tracking filter means with said center frequency of said swept carrier.

2. A tracking receiver as described in claim 1, wherein said tracking filter means comprises:

a mixer having two inputs and an output, said carrier input being applied to one input of said mixer;

a narrow band IF amplifier receiving the output of said mixer and producing said output of said tracking filter means;

an FM modulator receiving said sweep signal input and producing an output feeding the outer input of said mixer, said output of said FM modulator being of a center frequency required to produce a center frequency at the output of said mixer equal to the center frequency of said narrowband amplifier, and of sweep frequency, phase, and shape as that of the said swept carrier, and of sweep amplitude nearly the same as that of the said swept carrier.

3. A tracking receiver as described in claim 1, wherein said tracking filter means comprises a controlled narrowband filter.

4. A tracking receiver for swept carrier whose center frequency is being swept over a predetermined frequency band with a sweep waveform comprising a plurality of periodic components, said receiver comprising:

tracking filter means having a carrier input, a sweep signal input, and an output, and producing narrowband filtering for a wave being applied to said carrier input, said filtered wave appearing at said output, the center frequency of said narrowband filtering being responsive to a signal appearing at said sweep signal input;

receiving means for said swept carrier feeding said carrier input of said tracking filter;

FM discriminator means receiving said output of said tracking filter means and producing an error signal output comprising said plurality of periodic components of said sweep waveform;

error signal conditioner means receiving said error signal output and producing a plurality of outputs;

a plurality of phase-locked loops, each receiving a different output of said error signal conditioner and each being synchronized in frequency to a different periodic component of said sweep waveform and of substantially constant phase difference from it; and sweep signal conditioner means being fed from each of said phase-locked loops, and producing a sweep signal output, said sweep signal output feeding said sweep signal input of said tracking filter means, and being of shape and amplitude required to produce tracking filter of said center frequency of said narrowband filtering of said tracking filter means with said center frequency of said swept carrier.

5. A tracking receiver for a swept carrier whose center frequency is being swept over a predetermined frequency band with a sweep waveform comprising a swept subcarrier, said receiver comprising:

first tracking filter means having a carrier input, a first sweep signal input, and an output, and producing narrowwband filtering for a wave being applied to said carrier input, said filtered wave appearing at said output, the center frequency of said narrowband filtering being responsive to a signal appearing at said first sweep signal input;

receiving means for said swept carrier feeding said carrier input; first FM discriminator means receiving said output of said first tracking filter means and producing a first error signal output comprising said swept sub-carrier;

first error signal conditioner means receiving said first error signal output and producing main output, and a swept sub-carrier output;

a first phase-locked loop receiving said main output of said first error signal conditioner means and producing an output being of same frequency as said swept subcarrier and of substantially constant phase difference from it;

first sweep signal conditioner means receiving said output of said first phase-locked loop and producing a first sweep signal output, said first sweep signal output feeding said first sweep signal input of said first tracking filter means and being of frequency, phase, shape, and amplitude required to produce tracking of said center frequency of said narrow band filtering of said first tracking filter means with said center frequency of said swept carrier;

second tracking filter means having a sub-carrier input receiving said swept sub-carrier output, a second sweep signal input, and a filtered output, and producing narrowband filtering for a wave being applied to said subcarrier input, and filtered wave appearing at said filtered output, the center frequency of the narrowband filtering being responsive to a signal appearing at said second sweep signal input;

second FM discriminator means receiving said filtered output of said second tracking filter means and producing a second error signal output comprising a component at the sweep frequency of said swept sub-carrier;

second error signal conditioner means receiving said second error signal output and producing an output;

a second phase-locked loop receiving said output of said second error signal conditioner means and producing an output being of same frequency as said component of said second error signal output at the sweep frequency and of substantially constant phase difference from it; and second sweep signal conditioner means receiving said output of said second phase-locked loop and producing a second sweep signal output, said second sweep signal output feeding said second sweep signal input of said second tracking filter means, and being of frequency, phase, shape, and amplitude required to produce tracking of said center frequency of said narrowband filtering of said swept sub-carrier.

6. A tracking receiver as described in claim 1, including detecting means receiving a signal derived from said output of said tracking filter means, and producing a detected output.

7. A tracking receiver as described in claim 1, including lowpass filter means and amplifier means receiving signal derived from said error signal output of said FM discriminator means, and feeding said FM modulator to produce automatic frequency control.

8. A tracking receiver as described in claim 1, wherein the sweep of said swept carrier is of a sinusoidal waveform, said error signal conditioner means comprising circuit elements applying said error signal output of said FM discriminator means to the input of said phase-locked loop, and said sweep signal conditioner means comprising circuit elements producing phase shirting of said sinusoidal waveform.

* * * * *